(12) United States Patent
Aguren

(10) Patent No.: US 8,482,429 B2
(45) Date of Patent: Jul. 9, 2013

(54) SENSING ENVIRONMENTAL CONDITIONS USING RFID

(75) Inventor: Jerry Aguren, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 517 days.

(21) Appl. No.: 12/719,330

(22) Filed: Mar. 8, 2010

(65) Prior Publication Data

US 2011/0215946 A1 Sep. 8, 2011

(51) Int. Cl.
G08C 19/00 (2006.01)
G08C 19/38 (2006.01)

(52) U.S. Cl.
USPC .................................. 340/870.3; 340/870.39

(58) Field of Classification Search
USPC .............................. 340/870.3, 870.28, 870.39
See application file for complete search history.

(56) References Cited

U.S. PATENT DOCUMENTS

| | | | |
|---|---|---|---|
| 6,188,973 B1 * | 2/2001 | Martinez et al. | 702/188 |
| 6,577,978 B1 * | 6/2003 | Annan et al. | 702/104 |
| 6,977,587 B2 * | 12/2005 | Pradhan et al. | 340/539.26 |
| 7,436,303 B2 * | 10/2008 | Tourrilhes et al. | 340/572.1 |
| 7,857,214 B2 * | 12/2010 | Saliaris | 235/383 |
| 2003/0046339 A1 * | 3/2003 | Ip | 709/203 |
| 2008/0272887 A1 * | 11/2008 | Brey et al. | 340/10.1 |
| 2011/0145631 A1 * | 6/2011 | Shankar et al. | 714/4.11 |

OTHER PUBLICATIONS

L. Lofgen, et al., "Low-power humidity sensor for RFID applications", 2008, Sweden.
"Self-Powered Wireless Temperature Sensors Exploit RFID Technology" Pervasive Computing, Jan.-Mar. 2006.
Alanson P. Sample, "Design of an RFID-Based Battery-Free Programmable Sensing Platform", IEEE Transactions on Instrumentation and Measurement, vol. 57, No. 11, Nov. 2008.

* cited by examiner

*Primary Examiner* — Peguy Jean Pierre

(57) ABSTRACT

RFID tag sensor devices are adapted to be mounted in locations relative to a rack mountable device to wirelessly report a condition relating to an operating environment of the rack mountable device at the location. The sensor device in some embodiments has a body having a mounting portion adapted to engage with at least one pre-configured environmental operating condition sense-location of a rack or rack mountable device.

18 Claims, 5 Drawing Sheets

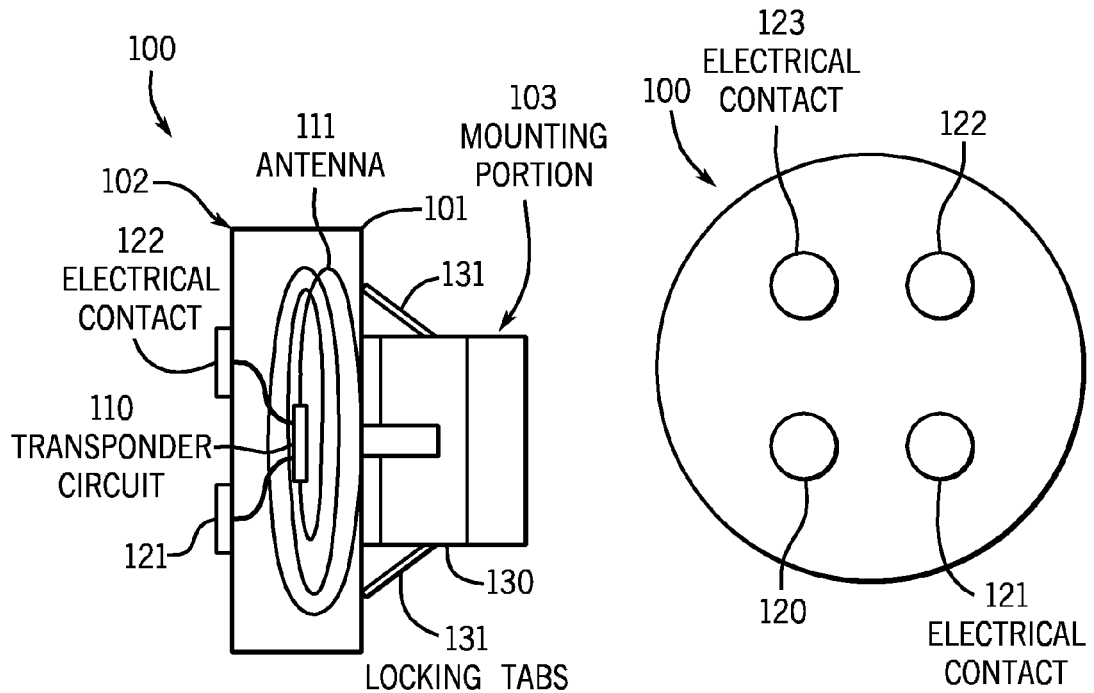
FIG. 1A
FIG. 1B
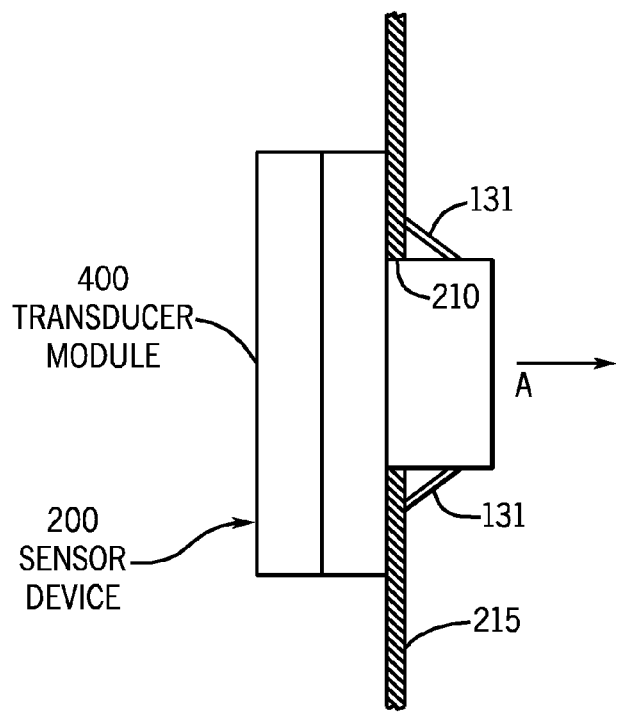
FIG. 2

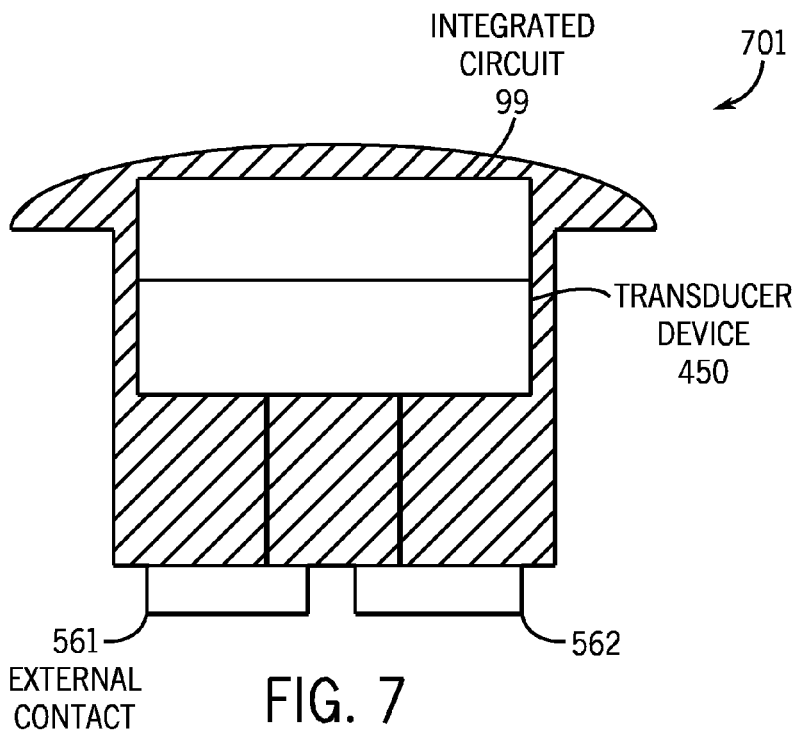
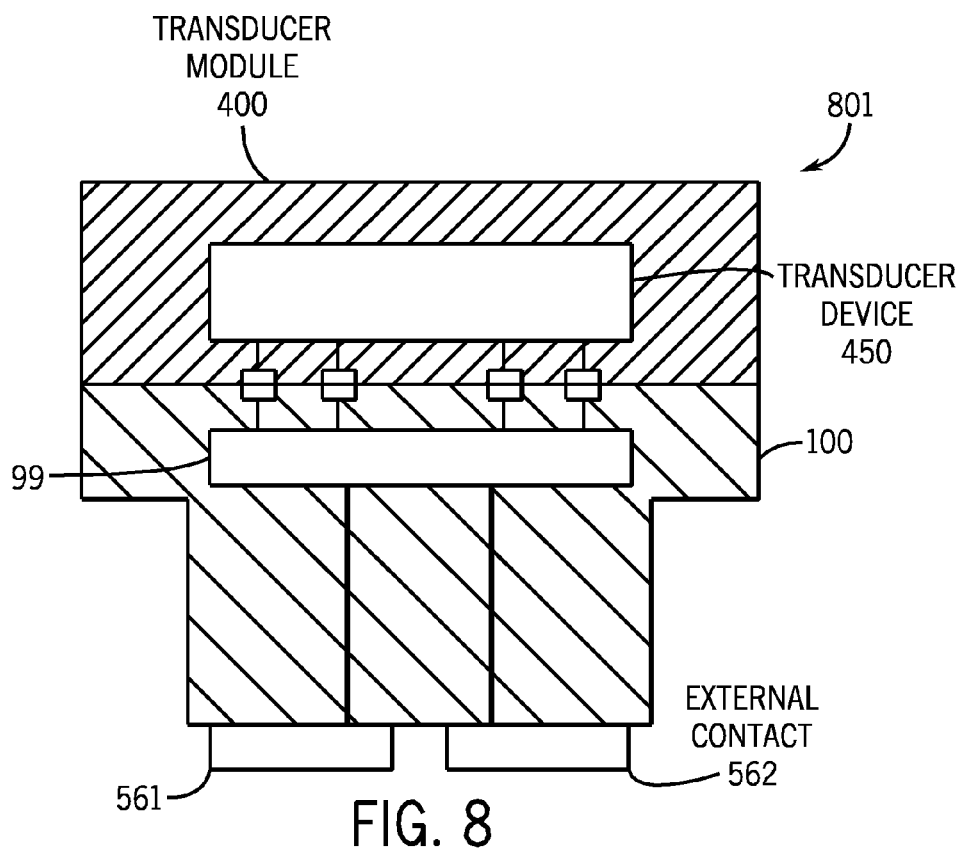

SENSING ENVIRONMENTAL CONDITIONS USING RFID

BACKGROUND OF THE INVENTION

Information handling devices such as, for example, storage devices, servers, network devices and other information technology (IT) equipment, can be mounted in racks, for example data centre racks and cabinets. With increasing use of smaller and more powerful processors, greater amounts of energy are being consumed by some information handling devices, and more heat is emitted, which can adversely affect device performance if the ambient temperature is not controlled. It is useful for persons associated with operating and managing information handling devices to receive timely information about environmental conditions such as, for example, temperature and other conditions, to assist operational decision making. Methods of using radio-frequency identification (RFID) sensors to track the presence and connectivity of assets, including cables, in a rack-based environment, have been described in the prior art. Many environmental sensor systems that are commonly available are not suitable for use in a rack based environment, for example because of complex cabling requirements, and/or cost in excess of the low price points necessary for widespread use, and/or inconvenient mounting systems and arrangements.

DESCRIPTION OF THE DRAWINGS

In order that the invention may be well understood, various embodiments thereof will be described, by way of example only, with reference to the accompanying drawings, in which:

FIGS. 1A and 1B are schematic diagrams showing an exemplary RFID transponder device module of a sensor device, respectively partially cut away from one side, and from one end;

FIG. 2 is a schematic diagram showing a sensor device mounted relative to a rack mountable device;

FIGS. 7 and 8 illustrate respective exemplary mechanical configurations of a unitary sensor device and a modular sensor device provided with external electrical contacts.

DETAILED DESCRIPTION

Figure 3A:
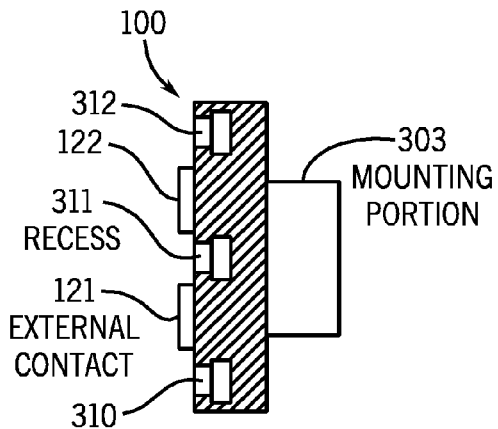
FIGS. 3A, 3B and 3C are schematic diagrams illustrating, from one side and respective opposite ends, further aspects of the transponder device module of FIGS. 1A and 1B.

In accordance with various embodiments of the invention, a plurality of RFID transponder equipped sensor devices is provided to sense and wirelessly report conditions relating to an operating environment of a rack-based arrangement of information handling devices. For example, the information handling devices can comprise storage devices, servers, network devices and/or other information technology (IT), communications or other equipment. The term rack as used herein relates to any physical framework suitable for supporting information handling devices, and without limitation includes, for example data centre racks and cabinets including or excluding doors, and/or any framework providing shelving, drawers and/or other mechanical arrangements for supporting devices. In at least some embodiments the sensor devices each comprise a respective body having a mounting portion adapted to selectively engage a plurality of predetermined mount locations relative to supportable information handling devices. For example, in at least some embodiments the mount locations can be provided in or on a rack-mountable device and/or in or on a rack or frame. At least some embodiments facilitate quick, and/or convenient, and/or accurate mounting, of wireless environmental sensors, to sense for example environmental air flow and/or environmental temperature, at any desired predetermined location to equipment in a rack environment, storing information relating to the respective predetermined mounting locations.

In at least some embodiments the sensor devices respectively comprise a transducer and a passive RFID transponder, or RFID tag, the transducer being operable, using power supplied from the RFID transponder, to sense an operating environment condition and communicate a resulting sensed-data signal to the RFID transponder. The transducer and transponder may be manufactured separately for subsequent interconnection, or integrally together for example on a single integrated circuit (IC) chip. Conveniently, the sensor devices use very low power transducers that can use power scavenged by circuits of the passive RFID transponder (also known as a passive RFID tag), for example from transmissions of an RFID reader, to sense a present environmental condition and output a corresponding sensed-data signal. The use of low power devices facilitates a reduction in size and/or cost due to a reduced requirement for an auxiliary power source, facilitating the positioning of multiple sensor devices in a relatively small area and/or better enabling provision of redundant sensor devices.

In at least some embodiments, the sensor devices can each comprise an assembly of a passive RFID transponder device module and an environmental condition transducer module, mechanical and electrical connection interfaces being provided between the modules. In at least some embodiments, the RFID transponder device module is operable to supply power to operate the transducer module, receive sensed data from the transducer module, and externally communicate the sensed data. At least some embodiments facilitate obtaining economies of scale and lower costs, using the modular approach with a common RFID transducer module.

In some embodiments, the RFID sensor devices are provided with externally visible identification characteristics denoting sensor type, for example markings and/or colouring on at least a portion of the sensor device body. Conveniently, at least a portion of each sensor device is colour coded according to the type or types of operating environment condition that it is capable of sensing. Conveniently, at least the transducer module is colour coded according to sensing capability. Colour coding can be conveniently provided, for example, by using a coloured mouldable plastics material for at least a portion of the sensor device body. Marking and/or colour coding of the sensor device body facilitates quick and/or accurate matching of sensor devices of desired type to selected predetermined mount locations.

At least some embodiments of the invention facilitate the quick and convenient fitting of wireless sensors that can inform a management database of multiple present environmental conditions relating to rack-based equipment, for example information handling devices in a data center. At least some embodiments facilitate the provision of small and/or low cost wireless sensors. At least some embodiments facilitate the provision of redundant wireless sensors to facilitate improved reliability of reported information. At least some embodiments facilitate the provision of an environmental sensor device network without the provision of data cabling and/or power cabling to the sensor devices.

Figure 6:
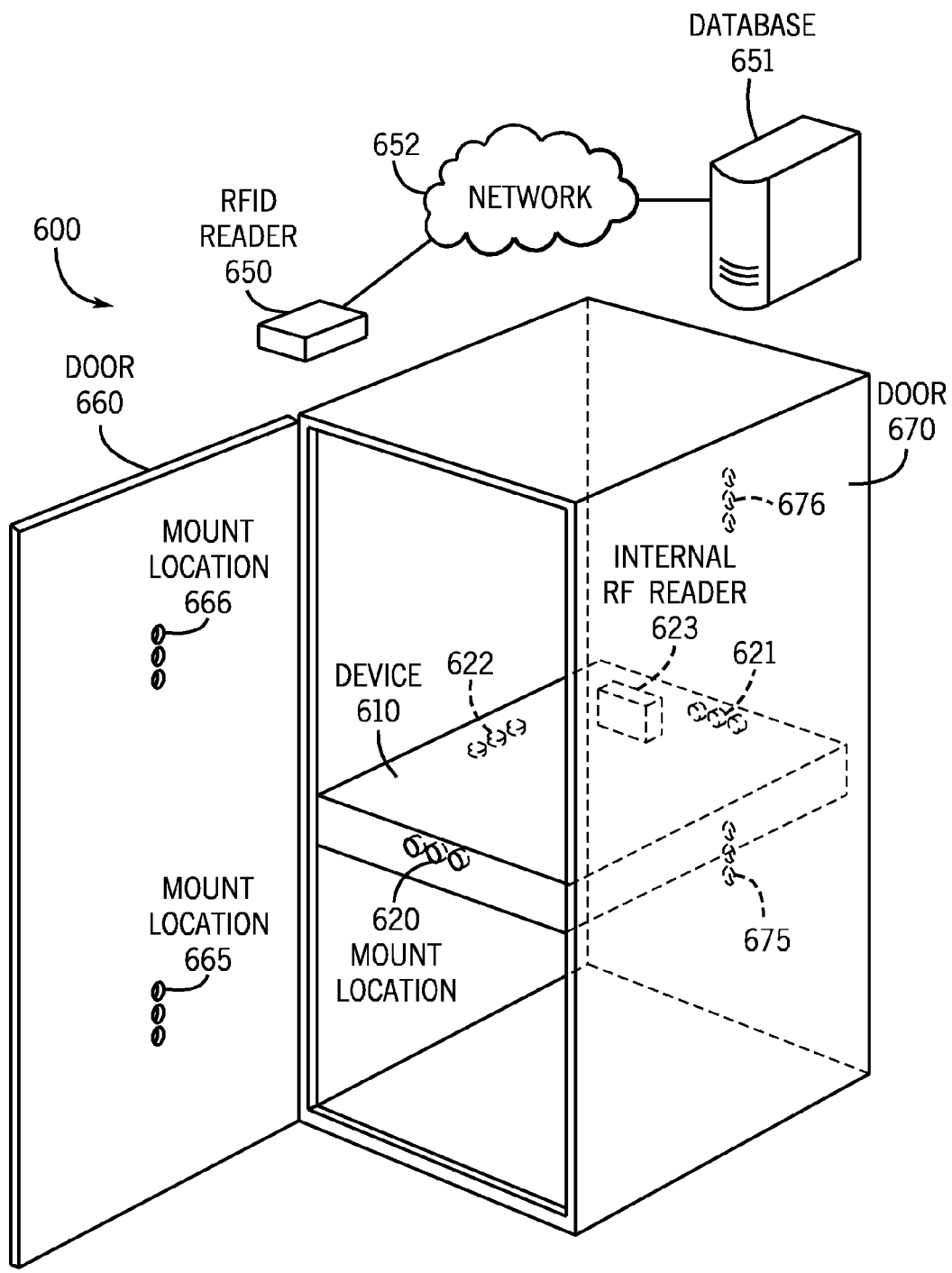
FIG. 6 is a schematic perspective view of a frame or rack apparatus supporting a rack-mountable device, illustrating exemplary predetermined sensor device mount locations.

As shown in FIGS. 1A and 1B, a radio frequency ID (RFID) transponder device module 100 comprises a body 101 having a transponder connector portion 102, and a mounting portion 103 to mount the module 100 relative to a sense-location of a rack or rack mountable device (FIG. 6). The body 101 supports a transponder circuit 110 connected to an antenna 111, shown in FIG. 1A which is partially cut away through the transponder connector portion 102, and external electrical contacts 120, 121, 122, 123 connected internally to the transponder circuit 110.

The transponder device module 100 is connectable to a transducer module 400 (FIGS. 2 and 4) to form a sensor device 200. The mounting portion 103 of the sensor device 200 is configured to engage, for example, with a predetermined, preconfigured mount location on or in an information handling device or supporting rack. The mount location may provide a complimentary engagement arrangement, for example, in the form of an appropriately configured hole 210 or recess at a desired predetermined sense-location in an external or internal wall 215 of the information handling device or the rack. Conveniently, the mounting portion 103 is adapted to mechanically engage the mount location by for example, press fitting, friction fitting, screw fitting, snapped fitting, and/or spring locking, or in any other appropriate manner.

In the embodiment of FIGS. 1 and 2, the transponder device module 100 is provided with a strip or ring 130 extending peripherally about the mounting portion 103. The ring 130 provides radially extending resiliently deflectable locking tabs 131 that deflect radially inwardly as the mounting portion 103 is inserted one into the hole 210 in the direction of arrow A (to the right in FIG. 2). The inwardly deflected locking tabs 131 exert a radially outwardly directed resilient force, causing the locking tabs 131 to move radially outwardly once the mounting portion 103 is sufficiently inserted through the hole 210, thereby locking the sensor device 200 at the mount location. The engagement mechanism described with reference to FIGS. 1 and 2 facilitates quick and convenient mounting by hand, without the use of tools, at a desired predetermined mount location. At least the mounting portion 103 conveniently comprises a mouldable plastics material, for example polycarbonate (PC) or acrylonitrile butadiene styrene (ABS), and the ring 130 and locking tabs 131 conveniently comprise a stamped metal sheet material. Conveniently, the mounting portion 103 and the connector portion 102 are contiguous and fabricated contemporaneously using the mouldable plastics material. In alternative embodiments, the ring 130 can be omitted, and the plastics mounting portion 103 is friction fitted into a hole or recess, or an alternative mechanical engagement arrangement is provided.

Figure 3B:
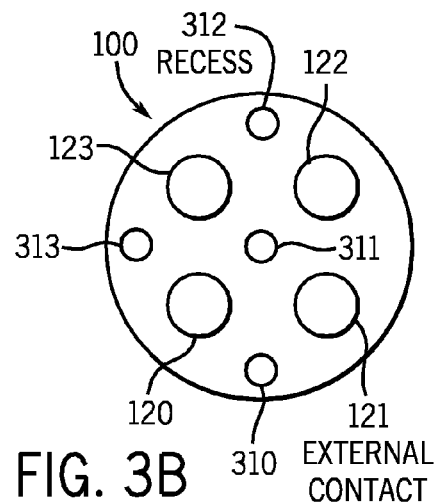
Figure 3C:
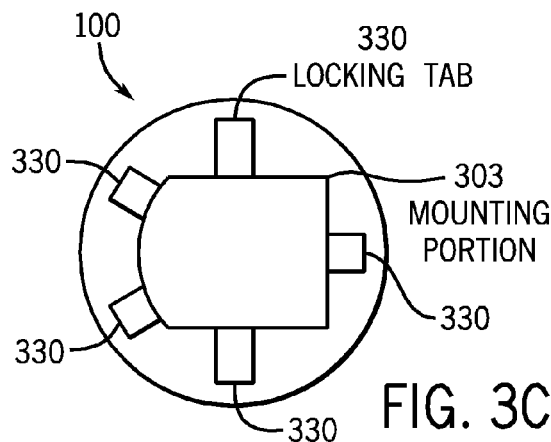
Figure 4A:
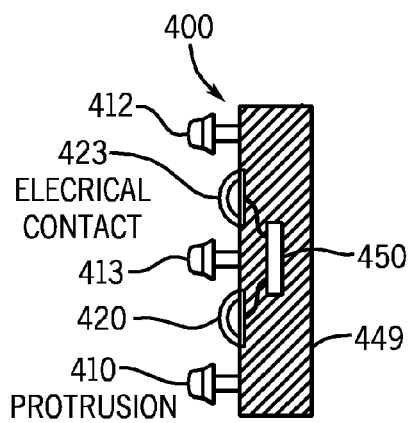
FIGS. 4A and 4B are schematic diagrams illustrating aspects of a transducer module connectable to the transponder device module.
Figure 4B:
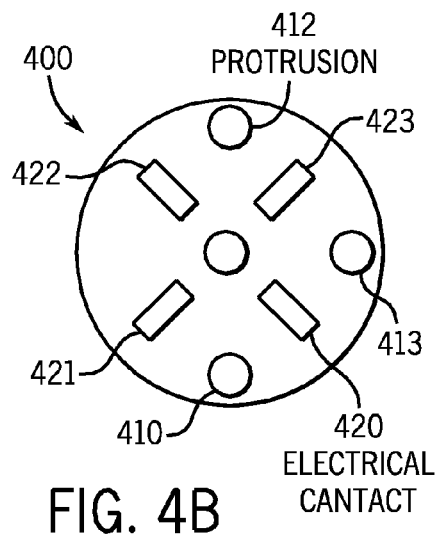

FIGS. 3 and 4 illustrate further features of the RFID transponder device module 100 and the transducer module 400. FIGS. 3A and 3B show recesses 310, 311, 312, 313 having relatively narrow entrance passages that extend inwardly from a face of the transponder device module 100 and open into respective wider cavities in the transponder device module 100. FIG. 4 shows protrusions 410, 411, 412, 413 extending outwardly away from a face of the transducer module 400. The protrusions 410, 411, 412, 413 correspond respectively to the recesses 310, 311, 312, 313 of the transponder device module 100. To physically interconnect the transponder device module 100 and the transducer module 400, the protrusions 410, 411, 412, 413 are aligned with the recesses 310, 311, 312, 313 and the opposite faces of the RFID transponder device module 100 and the transducer module 400 are moved together such that resilient nodules disposed at respective distal ends of the protrusions 410, 411, 412, 413 are resiliently compressed and moved through the narrow entrance passages of the recesses 310, 311, 312, 313 and into the respective wider cavities, where the nodules resiliently expand so as to provide a locking action to interconnect the transponder device module 100 and the transducer module 400 in a desired relative orientation.

The transducer module 400 comprises a transducer 450 electrically connected to electrically conductive contacts 420, 421, 422, 423, comprising for example respective resiliently arranged metallic strips, disposed at or on the face of the transducer module 400. The contacts 120, 121, 122, 123 of the RFID transponder device module 100 and the contacts 420, 421, 422, 423 of the transducer module 400 are configured and arranged such that they are respectively brought into mutual alignment and mutual electrical contact when the transducer module 400 and the transponder device module 100 are brought into face-to-face abutment using the protrusion/recess locking mechanism described above.

The transducer 450 may be at least partially enclosed by a body of the transducer module 400. For example, the transducer module 400 may have a body 449 enclosing or encasing the transducer 450. The transducer module body 449 conveniently comprises a mouldable plastics material, for example polycarbonate (PC) or acrylonitrite butadiene styrene (ABS). Conveniently, the transducer module body is colour coded according to the sensing capability of the transducer 450. The transducer module body may comprise modifications according to the type of transducer, such as passages (not shown), for example mutually orthogonal passages, extending between a peripheral surface of the transducer module body 449 and the transducer 450 to better enable sensing of airflow, and/or other arrangements for better exposing the transducer 450 to an environmental condition to be sensed.

To provide orientation of the sensor device 200 relative to a mount location of an information handling device or a rack, a mounting portion 303 (FIG. 3) may be provided with an orientation mechanism. For example, the mounting portion 303 may be keyed or asymmetrically configured, for example, as shown in FIG. 3C, and used with a correspondingly configured mount location hole 210 or recess to provide a desired predetermined relative orientation of the sensor device 200 and the mount location. Orientation of the sensor device 200 may be used, for example, to better align airflow receiving passages of the sensor device 200 with anticipated environmental airflows to be sensed. The resilient locking tab mechanism of FIG. 2 can be adapted to provide locking tabs 330 for use with the asymmetrical mounting portion of FIG. 3C.

Figure 5:
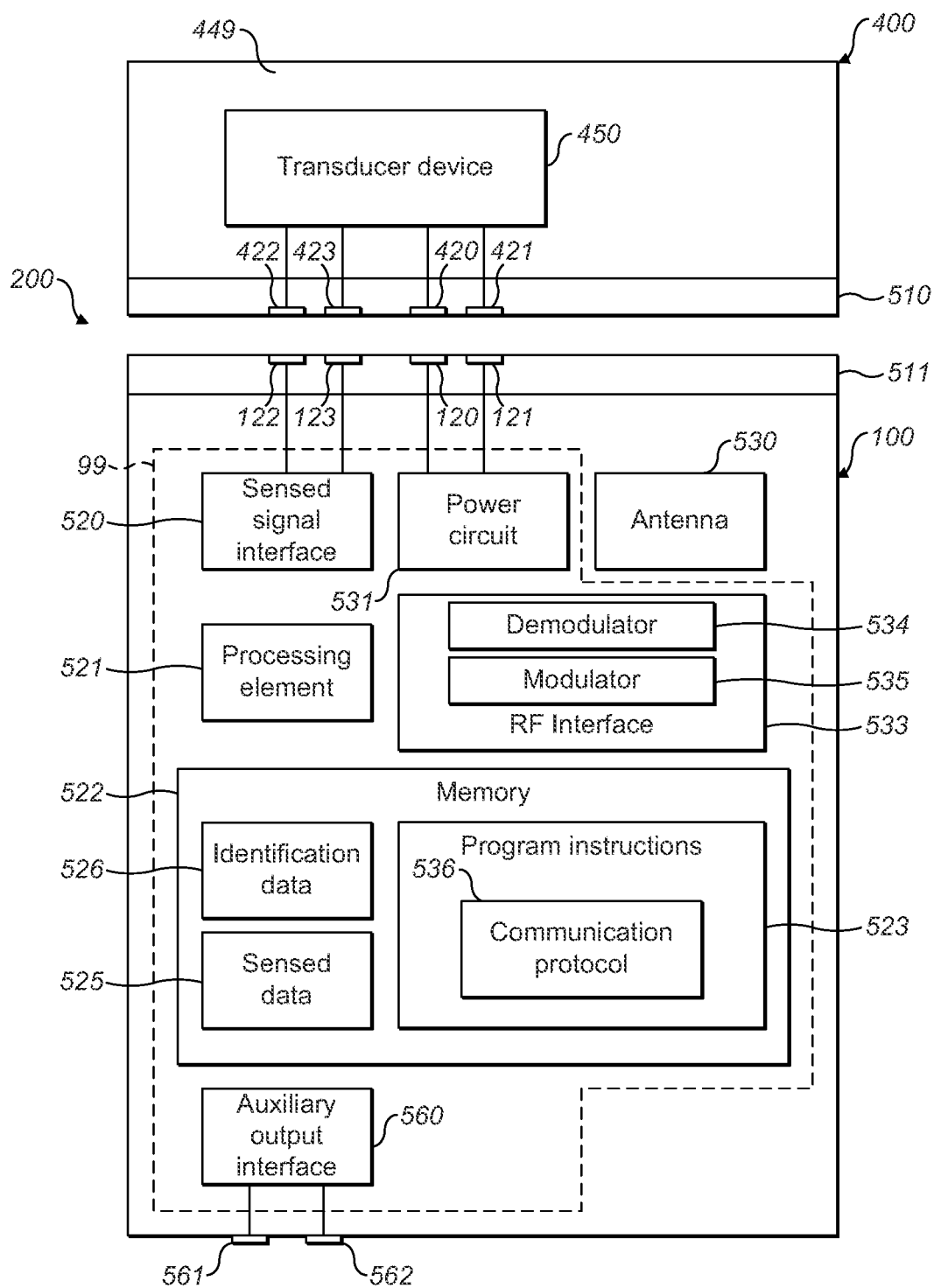
FIG. 5 is a schematic diagram showing functional elements of a transducer module and a transponder device module.

FIG. 5 shows various functional elements of the sensor device 200 comprising the transducer module 400 and the transponder device module 100. The transducer module 400 provides a physical interface 510 arranged to connect with a physical interface 511 of the transponder device module 100. For example, the respective interfaces 510, 511 comprise the electrical contacts 420, 421, 422, 423 and 120, 121, 122, 123 together with the respective protrusions 410, 401 412, 413 and recesses 310, 311, 312, 313. The transducer device 450 provides an electrical signal representative of an environmental condition through the contacts 422 423 and the contacts 122, 123 to a sensed signal communication interface 520 of the RFID transponder device module 100. In at least some embodiments, the transducer device 450 may provide an analog signal to the signal interface 520, and the signal interface 520 may comprise an analog to digital interface. In alternative embodiments, the transducer device 450 comprises an integrated circuit operable to output a digital sensed-data signal to the signal interface 520, and the signal interface 520 comprises an I2C interface or any other suitable digital data communications interface. In some embodiments, particularly where the transducer device 450 provides processing to output a digital signal, the transducer device module 400 may comprise a battery to supply the required power to drive the sensing and processing operations.

In at least some embodiments, the transponder device module 100 comprises a circuit, such as an integrated circuit 99, comprising a data processing element 521 and memory 522, for example EEPROM or flash memory, storing program instructions 523 executable by the processing element 521 to provide functionality of the transponder device module 100. The transponder device module 100 is operable to receive and transmit RF signals through antenna 530 and an RF communication interface 533, using energy scavenged, or harvested, from the received signals using a parasitic power circuit 531. The RF interface 533 can be implemented at least in part by the processing element 521 and program instructions 523, and includes a demodulator 534 and a modulator 535. The RF interface 533 is operable to receive and process requests from an RF reader device 650 (FIG. 6) to store identification data 526 in predetermined locations in memory 522, or to report identification data 526 and/or sensed data 525 from predetermined locations in memory 522, in accordance with a data communication protocol 536.

The transponder device module 100 is also programmed and arranged to store sensed-data signals from the transducer device 450, received at the signal interface 520, at predetermined locations in memory 522, in the form of sensed data values 525. The identification data 526 comprises, for example: data identifying the transponder device module 100; a type of transducer module 400 of the sensor device 200; a rack identifier; a location in the rack (for example a U location) at which a sensed tag 200 has been located, and/or any other desired identification data. Identification data can be loaded into the memory using an RF reader, in accordance with the communication protocol 536, at any convenient time. For example, sensor devices 200 may be factory mounted and preprogrammed in factory, or may be mounted in the field and programmed by field personnel, for example using suitably adapted handheld RFID readers.

The transducer device 450 conveniently uses a very low power transducer that can operate using power scavenged by the parasitic power circuit 531, for example a transducer that operates using power in the low µW range or fractions of a µW. In some embodiments, the passive RFID transponder device module 100 may comprise auxiliary energy storage in the form of a capacitive storage device (not shown), to temporarily store energy generated by the parasitic circuit 531. In some embodiments, the sensor device 200 may be fabricated by providing a passive transducer and an active or passive transponder device. In some embodiments, the transducer and transponder device have a common supporting body, for example a transducer and a transponder device are encased in a common moulded plastics body. In some embodiments, the transducer can be fabricated on a single chip together with the transponder device.

FIG. 6 shows a frame suitable for supporting information handling devices. The exemplary frame comprises a data centre rack unit 600, shown supporting a single device 610 for clarity purposes. The data centre rack unit 600 comprises predetermined and preconfigured mount locations for mounting sensor devices 200. For example, two groups 665, 666 of mount locations are arranged in rows aligned in an up-down direction of respective front (shown open) and back (shown closed) doors 660, 670 of the data center rack unit 600. In some embodiments, each of the groups 665, 666, 675, 676 is respectively disposed in a laterally central portion of each of the doors 660, 670. The doors may, for example, comprise perforated portions (not shown) to allow the flow of air therethrough for cooling purposes, and the mount locations may be disposed, for example, in a perforated or non-perforated portion of the door. Other groups of mount locations can be provided as desired for measuring environmental conditions at any desired location on the rack unit 600. Further groups 620, 621 of mount locations may be provided as desired, for example, at disparate locations on the casing of the information handling device 610.

The sensor devices 200 can conveniently be read by at least one RFID reader 650, or interrogator, located in a vicinity of the rack-based arrangement of information handling devices, for example on or near the rack unit 600. The reader 650 is operable to communicate the sensed environmental data by means of any convenient protocol, for example LLRP (low-level reader protocol), to an infrastructure management database, for example through any convenient type of data communication network 652. The reader device 650 can be located in any convenient location on the rack unit 600. Conveniently, a plurality of readers 650 is provided per rack unit 600, for example, four readers 650 may be provided, two in an upper region of the rack unit and two in a lower region of the rack unit, the precise locations of the readers being arranged for maximum effectiveness taking into account the predetermined sensor device mount locations. The sensor devices 200 in accordance with at least some embodiments described herein are compact and relatively low cost and/or low power in nature. This facilitates the provision of redundant sensors of different types in multiple locations within a rack-based arrangement of information handling devices. By way of non-limiting example, approximately eight hundred sensor devices 200 could be provided in a single rack unit 600, with four readers 650 reading the sensor devices 200 according to a round robin polling algorithm, or in any other convenient manner.

In some embodiments, mounting locations are provided internally of the information handling device 610, for example in one or more groups 622, to sense environmental conditions at desired locations internally of the device 610. When sensor devices 200 are mounted internally, one or more corresponding internal RF readers 623 can be provided, the readers 623 being operable to communicate the identification data 526 and sensed data 525 using any convenient protocol to an infrastructure management database 651. By way of non-limiting example, readers 623 may have separate cabling to connect to the database 651 using the LLRP protocol, for example through a network, or may be connected to circuits of the information handling device 610 to communicate with the database 651 through the information handling device 610 using for example the I2C protocol.

In some embodiments, the transponder device module 100 further comprises an auxiliary communication interface 560 arranged to communicate data through external contacts 561, 562. The external contacts 561, 562 can for example be electrically conductive pads that are electrically connectable to contacts of a circuit of an information handling device in the form of a computer system, when the transponder device is mounted internally of a housing of the computer system. The auxiliary interface can comprise any convenient protocol to enable communication of the identification data 526 and sensed data 525 to the computer system, for example the I2C protocol. The computer system can be used to communicate the data 525, 526 to the database 651. FIGS. 7 and 8 illustrate respective exemplary mechanical configurations of a sensor device 701 having a unitary body, and a sensor device comprising a modular arrangement 801, the sensor devices 701, 801 each being provided with external electrical contacts 561, 562.

The type of sensor device 200 can vary between the groups 666, 665, 675, 676, 620, 621, 622 of sensor devices 200. For example, groups 666, 676 may each comprise three temperature sensing devices 200, groups 665, 675 may each comprise three airflow sensing devices, group 620 may comprise three humidity sensing devices, group 221 may comprise three shock and/or vibration sensing devices and group 621 may comprise three internal temperature sensing devices.

Sensor devices 200 in accordance with at least some embodiments can be fitted in the preconfigured mount locations in factory during manufacture and/or configuration of a rack unit 600 or information handling device 610 to an integrator or end user. Alternatively, the sensor devices 200 can be fitted by an integrator or end user, for example during configuration of an infrastructure management network at a user's premises or when replacing failed sensor devices 200. Storing of at least some of the identification data 526 to the memory 522 can conveniently be performed using a handheld RFID reader (not shown). In at least some embodiments relatively low-cost and compact sensor devices 200 can be provided that are easily mountable in preconfigured mount locations with or without the use of tools and without power or data cabling, various types of sensor device 200 being easily distinguishable for use in sensing different environmental conditions, for example by colour-coded moulded plastics sensor bodies.

What is claimed is:

1. An environmental condition sensing system comprising:
a plurality of sensor devices, each of the sensor devices including an RFID transponder and a transducer module, to sense and wirelessly report conditions relating to an operating environment of a rack-based arrangement of information handling devices, wherein the transducer module of at least one of sensor devices is to use power scavenged by the respective RFID transponder from an RFID reader device, to sense a respective operating environment condition and to transmit a corresponding sensed data to the respective RFID transponder,
wherein at least some of the sensor devices comprise respective bodies having respective mounting portions to selectively engage with a plurality of respective predetermined mount locations relative to the information handling devices,
and wherein at least some of the sensor devices are to sense different respective types of operating environment conditions and to store the operating environment conditions in their respective RFID transponders.

2. The environmental condition sensing system of claim 1, wherein the RFID transponder of the at least one sensor device is a passive RFID transponder.

3. The environmental condition sensing system of claim 1, the mounting portions to mechanically engage the respective predetermined mount locations by at least one of: press fitting, friction fitting, screw fitting, snap fitting, spring locking.

4. The environmental condition sensing system of claim 1, the mounting portions to engage the respective predetermined mount locations without use of tools.

5. The environmental condition sensing system of claim 1, wherein at least the mounting portions of the respective sensor bodies comprise a moldable material that also encases at least the corresponding RFID transponder.

6. The environmental condition sensing system of claim 1, wherein at least some of the sensor devices are to report an operating environment condition relative to an information handling device, power supply or other rack mounted electrical device, the operating environment condition being selected from at least one of: temperature, humidity, shock, vibration and air flow.

7. The environmental condition sensing system of claim 1, wherein at least some of the sensor devices are color coded according to sensing capability.

8. The environmental condition sensing system of claim 1, wherein the RFID transponder of at least one of the sensor devices includes a memory to store the corresponding operating environment condition.

9. A data center comprising a plurality of sensor devices, each having an RFID transponder and a transducer module, and each having respective mounting portions selectively engaged at a plurality of respective preconfigured mount locations of a data center rack and/or rack-mounted information handling devices, at least some of the sensor devices being configured to sense different respective types of operating environment conditions, to store the operating environment conditions in their respective RFID transponders, and to report the operating environment conditions through at least one RFID reader to a data center management database,
wherein the transducer module of at least one of the sensor devices is to use power scavenged by the respective RFID transponder from the at least one RFID reader, to sense a respective operating environment condition and to transmit a corresponding sensed data to the respective RFID transponder.

10. The data center of claim 9, the sensor devices being engaged at the respective preconfigured mount locations by at least one of: friction fitting, screw fitting, snap fitting, spring locking.

11. The data center of claim 8, wherein the sensor devices mounted are in groups at at least some of the mount locations, to provide redundancy.

12. An RFID tag sensor device, comprising:
an RFID transponder module including a body having a mounting portion to engage with at least one pre-configured environmental operating condition sense-location of a rack or rack mountable device, wherein the sensor device is to be mounted in any desired predetermined location relative to the rack mountable device to wirelessly report a condition relating to an operating environment of the rack mountable device at the predetermined location;
a transducer module to sense an environmental condition and to transmit a corresponding sensed data to the transponder module, wherein the transducer module has at least one hole into which the mounting portion of the RFID transponder module is inserted to engage the RFID transponder module and the transducer module; and
external electrical contacts, wherein the sensor device is to output identification data and sensed data through the electrical contacts using an auxiliary data communication interface.

13. The sensor device of claim 12, wherein the mounting portion of the body is to mount at the desired predetermined location by at least one of: press fitting, friction fitting, screw fitting, snap fitting, spring locking.

14. The sensor device of claim 12, at least the mounting portion of the body comprising a moldable material color coded according to a sensing capability of the sensor device.

15. The sensor device of claim 12, wherein the environmental condition is selected from at least one of: temperature, humidity, shock, vibration and air flow.

16. The RFID tag sensor device of claim 12, wherein the transducer module is to use power scavenged by the RFID transponder module from an RFID reader device.

17. A passive RFID transponder device module selectively connectable to a plurality of types of transducer module to form a sensor device mountable to or about a rack mountable device, at preconfigured mount locations, to report a condition relating to an operating environment of the rack mountable device, the RFID transponder device module being operable to supply power to operate the transducer module, receive sensed data from the transducer module, and output an RF signal to externally communicate the sensed data,
  wherein the transducer module is to use power scavenged by the passive RFID transponder device module from an RFID reader device, to sense an operating environment condition and transmit a corresponding sensed data signal to the passive RFID transponder device module.

18. The passive RFID transponder device module of claim 17, at least some of the plurality of transducer modules being respectively operable to sense different operating environment conditions, and being color coded according to sensing capability.

* * * * *

UNITED STATES PATENT AND TRADEMARK OFFICE
CERTIFICATE OF CORRECTION

| | | |
|---|---|---|
| PATENT NO. | : 8,482,429 B2 | Page 1 of 1 |
| APPLICATION NO. | : 12/719330 | |
| DATED | : July 9, 2013 | |
| INVENTOR(S) | : Jerry Aguren | |

It is certified that error appears in the above-identified patent and that said Letters Patent is hereby corrected as shown below:

In the Claims:

In column 8, line 37, in Claim 11, delete "claim 8," and insert -- claim 9, --, therefor.

Signed and Sealed this
Fifteenth Day of October, 2013

Teresa Stanek Rea
*Deputy Director of the United States Patent and Trademark Office*